(12) United States Patent
Lee et al.

(10) Patent No.: US 9,544,012 B2
(45) Date of Patent: Jan. 10, 2017

(54) METHOD AND APPARATUS FOR CONTROLLING POWER SOURCE SEMICONDUCTOR

(71) Applicant: Hyundai Autron Co., Ltd., Seongnam-si (KR)

(72) Inventors: Soon Seob Lee, Seoul (KR); Tae Ok Ha, Seongnam-si (KR); Jong Ha Shin, Seoul (KR)

(73) Assignee: Hyundai Autron Co., Ltd., Seongnam-si, Gyeonggi-do (KR)

( * ) Notice: Subject to any disclaimer, the term of this patent is extended or adjusted under 35 U.S.C. 154(b) by 0 days.

(21) Appl. No.: 14/937,635

(22) Filed: Nov. 10, 2015

(65) Prior Publication Data
US 2016/0134326 A1    May 12, 2016

(30) Foreign Application Priority Data
Nov. 12, 2014    (KR) .................. 10-2014-0156974

(51) Int. Cl.
| | |
|---|---|
| *H04B 3/46* | (2015.01) |
| *G05F 1/00* | (2006.01) |
| *H04B 1/69* | (2011.01) |
| *H01L 23/24* | (2006.01) |
| *H02M 1/44* | (2007.01) |
| *H02M 1/14* | (2006.01) |

(52) U.S. Cl.
CPC .............. *H04B 1/69* (2013.01); *H01L 23/24* (2013.01); *H02M 1/44* (2013.01); *H02M 1/143* (2013.01)

(58) Field of Classification Search
CPC ......... H04B 1/709; H04B 7/0413; H04B 1/06; H04B 1/16; H04B 1/1607; H04B 17/24
USPC ........................................... 375/224; 315/194
See application file for complete search history.

(56) References Cited

U.S. PATENT DOCUMENTS

| | | | | |
|---|---|---|---|---|
| 4,633,161 A | * | 12/1986 | Callahan ............... | H02M 5/293 315/194 |
| 5,319,301 A | * | 6/1994 | Callahan ................. | H02M 1/44 315/294 |
| 8,400,230 B2 | | 3/2013 | Crawley et al. | |

(Continued)

FOREIGN PATENT DOCUMENTS

| | | |
|---|---|---|
| KR | 10-2004-0044421 A | 5/2004 |
| KR | 10-2011-0078987 A | 7/2011 |
| KR | 10-1136948 B1 | 4/2012 |

*Primary Examiner* — Daniel Washburn
*Assistant Examiner* — Sarah Hassan
(74) *Attorney, Agent, or Firm* — Morgan, Lewis & Bockius LLP

(57) ABSTRACT

A method for controlling a power source semiconductor may include: supplying, by a switching frequency supply unit, preset respective reference switching frequencies to a plurality of elements which are operated according to a respective switching frequency; sensing, by a control unit, sensing interference in the plurality of elements, based on operations of the elements according to the respective reference switching frequencies; setting, by the control unit, bandwidths for the respective reference switching frequencies when the interference in the plurality of elements is sensed; and increasing, by a bandwidth adjusting unit, bandwidth of the respective reference switching frequencies supplied through the switching frequency supply unit, based on the bandwidths for the respective reference switching frequencies.

8 Claims, 4 Drawing Sheets

(56) References Cited

U.S. PATENT DOCUMENTS

| | | | | |
|---|---|---|---|---|
| 2001/0024360 A1* | 9/2001 | Hirata | .................. | H05K 1/0225 361/780 |
| 2002/0047691 A1* | 4/2002 | Asada | ..................... | H02J 7/245 322/28 |
| 2003/0055406 A1* | 3/2003 | Lebel | ................. | A61N 1/37211 604/891.1 |
| 2004/0095114 A1* | 5/2004 | Kernahan | ............. | H02M 3/157 323/282 |
| 2004/0125529 A1* | 7/2004 | Arai | ....................... | H01L 23/24 361/118 |
| 2006/0291115 A1* | 12/2006 | Song | ................. | H01L 27/14601 361/56 |
| 2010/0164570 A1* | 7/2010 | Priego | ................. | H02M 3/1584 327/157 |
| 2010/0244928 A1* | 9/2010 | Lavery | ............ | H03K 19/00384 327/391 |
| 2011/0135027 A1* | 6/2011 | Saraswat | .................. | H03K 3/84 375/285 |
| 2015/0109833 A1* | 4/2015 | Garrity | .................. | H02M 1/36 363/37 |

\* cited by examiner

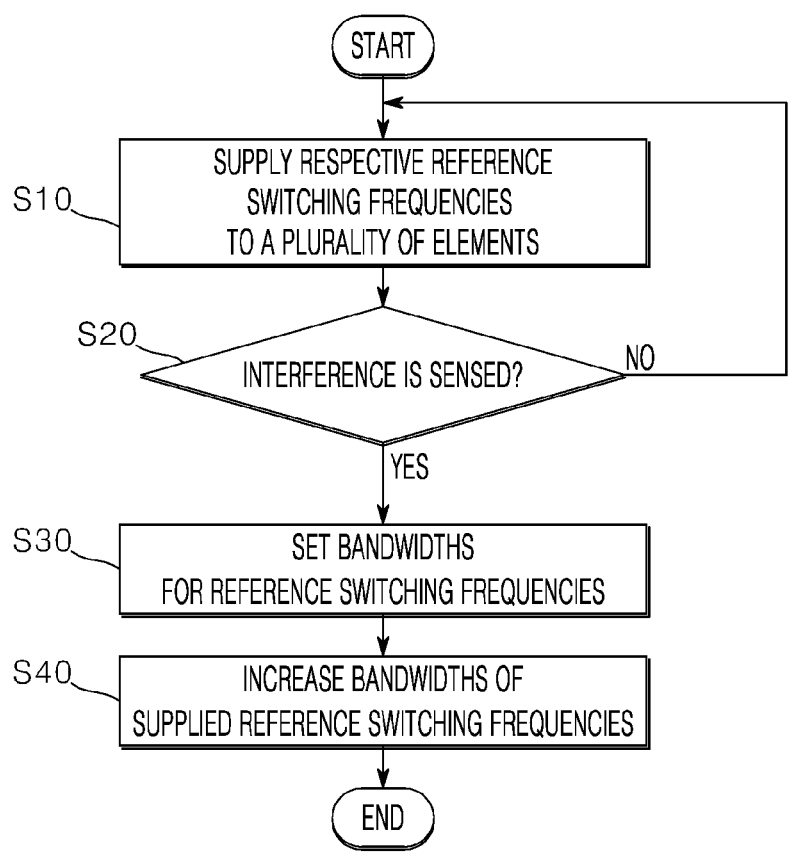

METHOD AND APPARATUS FOR CONTROLLING POWER SOURCE SEMICONDUCTOR

CROSS-REFERENCES TO RELATED APPLICATIONS

The present application claims priority to Korean application number 10-2014-0156974, filed on Nov. 12, 2014, which is incorporated by reference in its entirety.

BACKGROUND OF THE INVENTION

The present invention relates to a method and apparatus for controlling a power source semiconductor, and more particularly, to a method and apparatus for controlling a power source semiconductor, which is capable of reducing the influence of interference caused by electromagnetic wave noise between elements operating at a fixed switching frequency, thereby preventing malfunctions of the respective elements.

These days, with the development of electronic devices, a large number of parts included in a vehicle rely on the control of the electronic devices, in order to improve the performance of the vehicle. For example, in order to improve the performance of an engine, various sensors are used to achieve the optimal engine efficiency. Therefore, the reliability of the vehicle is improved.

Furthermore, the electronic devices are not only applied to the engine operation for accomplishing the fundament purpose of the vehicle, but also applied to safety devices for securing a driver's safety or various additional devices for a driver's convenience.

Since the various electronic devices of the vehicle require different levels of power for their operations, the vehicle includes a power source semiconductor.

The power source semiconductor is a device which supplies power required for the electronic devices of the vehicle. The power source semiconductor converts the battery power of the vehicle into voltages required for the respective electronic devices, and supplies the voltages to normally operate the electronic devices.

The related art of the present invention is disclosed in Korean Patent Laid-open Publication No. 2004-0044421 published on May 28, 2004 and entitled "Semiconductor Device".

Among elements included in the conventional power source semiconductor for a vehicle, specific elements are operated at a specific switching frequency. In order to operate the specific elements, the conventional power source semiconductor supplies signals at switching frequencies corresponding to the respective elements.

Thus, in the conventional power source semiconductor, electromagnetic wave noise may occur due to the switching frequencies of the respective elements, thereby causing interference for the operations of other surrounding elements.

BRIEF SUMMARY

Embodiments of the present invention are directed to a method and apparatus for controlling a power source semiconductor, which is capable of reducing the influence of interference caused by electromagnetic wave noise between elements operating at a fixed switching frequency, thereby preventing malfunctions of the respective elements.

In one embodiment, a method for controlling a power source semiconductor may include: supplying, by a switching frequency supply unit, preset respective reference switching frequencies to a plurality of elements which are operated according to a respective switching frequency; sensing, by a control unit, sensing interference in the plurality of elements, based on operations of the elements according to the respective reference switching frequencies; setting, by the control unit, bandwidths for the respective reference switching frequencies when the interference in the plurality of elements is sensed; and increasing, by a bandwidth adjusting unit, bandwidth of the respective reference switching frequencies supplied through the switching frequency supply unit, based on the bandwidths for the respective reference switching frequencies.

In the increasing of the bandwidth of the reference switching frequencies, the bandwidth adjusting unit increases the bandwidth of the reference switching frequencies through a spread spectrum method.

The plurality of elements which are operated according to the respective switching frequency comprise a DC/DC converter and a charge pump.

In the setting of the bandwidths for the respective reference switching frequencies, the control unit sets the bandwidths for the respective reference switching frequencies such that the bandwidths are proportional to a magnitude of respective reference switching frequency.

In the setting of the bandwidths for the respective reference switching frequencies, the control unit sets the bandwidths for the respective reference switching frequencies to values obtained by multiplying the respective reference switching frequency by a preset reference ratio.

In another embodiment, an apparatus for controlling a power source semiconductor may include: a switching frequency supply unit configured to supply preset respective reference switching frequencies to a plurality of elements which are operated according to a respective switching frequency; a control unit configured to sense interference in the plurality of elements based on the operations of the elements according to the respective reference switching frequencies, and set bandwidths for the respective reference switching frequencies when the interference in the elements is sensed; and a bandwidth adjusting unit configured to increase bandwidth of the respective reference switching frequencies supplied through the switching frequency supply unit, based on the bandwidths for the respective reference switching frequencies.

The bandwidth adjusting unit increases the bandwidth of the respective reference switching frequencies through a spread spectrum method.

The plurality of elements which are operated according to the respective switching frequency comprise a DC/DC converter and a charge pump.

The control unit sets the bandwidths for the respective reference switching frequencies such that the bandwidths are proportional to a magnitude of respective reference switching frequency.

The control unit sets the bandwidths for the respective reference switching frequencies to values obtained by multiplying the respective reference switching frequency by a preset reference ratio.

BRIEF DESCRIPTION OF THE DRAWINGS

FIG. 4 is a flowchart illustrating a method for controlling a power source semiconductor in accordance with an embodiment of the present invention.

DETAILED DESCRIPTION

Embodiments of the invention will hereinafter be described in detail with reference to the accompanying drawings. It should be noted that the drawings are not to precise scale and may be exaggerated in thickness of lines or sizes of components for descriptive convenience and clarity only. Furthermore, the terms as used herein are defined by taking functions of the invention into account and can be changed according to the custom or intention of users or operators. Therefore, definition of the terms should be made according to the overall disclosures set forth herein.

Figure 1:
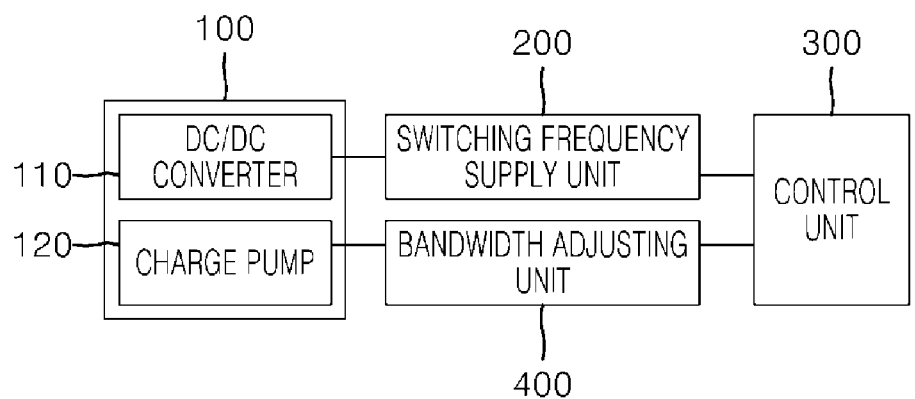
FIG. 1 is a block diagram of an apparatus for controlling a power source semiconductor in accordance with an embodiment of the present invention.

FIG. 1 is a block diagram of an apparatus for controlling a power source semiconductor in accordance with an embodiment of the present invention.

Referring to FIG. 1, the apparatus for controlling a power source semiconductor may include a switching frequency supply unit 200, a control unit 300, and a bandwidth adjusting unit 400.

The switching frequency supply unit 200 may supply reference switching frequencies to a plurality of elements 100 which are operated according to switching frequencies, respectively. The reference switching frequencies may be previously set according to the characteristics of the respective elements 100

Specifically, a vehicle may include a plurality of controllers (not illustrated) for controlling different operations, and the operations of the respective controllers may require different voltages.

Thus, the power source semiconductor for supplying the voltages required for the various controllers of the vehicle may control the plurality of elements 100 at different switching frequencies, and provide the voltages required for the respective controllers.

That is, since the plurality of elements 100 forming the power source semiconductor require different switching frequencies according to the operation characteristics of the respective elements, the respective reference switching frequencies indicating the switching frequencies required for the operations of the respective elements 100 may be previously set.

In the present embodiment, the plurality of elements 100 may include a DC/DC converter 110 and a charge pump 120. The DC/DC converter 110 may include a pre-regulator (boost-buck converter) for converting battery power into a voltage for a circuit inside an IC and a buck converter for supplying the voltage to the outside of the IC. The charge pump 120 may serve as a gate driver of an external switch, in order to protect the IC when the battery polarity is changed.

However, the present embodiment is not limited thereto. In addition to the DC/DC converter 110 and the charge pump 120, the plurality of elements 100 may include any elements as long as the elements are operated according to switching frequencies.

The control unit 300 may sense interference in the plurality of elements 100, based on the operations of the respective elements 100 according to the respective reference switching frequencies supplied through the switching frequency supply unit 200. When the interference in the plurality of elements 100 is sensed, the control unit 300 may set bandwidths for the respective reference switching frequencies.

Specifically, in order to sense the interference in the plurality of elements 100, the control unit 300 may use a method of determining whether target outputs which are to be outputted from the respective elements 100 fall within an error range. Furthermore, the control unit 300 may sense the interference in the plurality of elements 100 through various methods which are publicly known or not publicly known.

As such, the apparatus for controlling a power source semiconductor in accordance with the present embodiment may transmit the switching frequencies at a wide bandwidth, in order to prevent the problem that the operation of each of the elements 100 malfunctions due to electromagnetic wave noise caused by the switching frequency of another element 100.

That is, since power is distributed when frequency signals are spread and transmitted at a wide bandwidth, the frequency signals may be less affected by noise than frequency signals which are transmitted at a narrow bandwidth.

Thus, when interference is sensed as the plurality of elements 100 are operated according to the respective reference switching frequencies, the apparatus for controlling a power source semiconductor in accordance with the present embodiment may set bandwidths for the respective reference switching frequencies, thereby reducing the influence caused by the interference.

Specifically, the control unit 300 may set the bandwidths for the respective reference switching frequencies to values corresponding to a magnitude of respective reference switching frequency, respectively. More specifically, the control unit 300 may set the bandwidths for the respective reference switching frequencies to values proportional to the magnitudes of the reference switching frequencies.

For example, the control unit 300 may set the bandwidths for the respective reference switching frequencies to values obtained by multiplying the respective reference switching frequency by a preset reference ratio, respectively.

At this time, the reference ratio may indicate a ratio for the reference switching frequencies, which corresponds to a level having no influence on normal operations of the respective elements 100. In the present embodiment, the reference ratio may be set to 5% or 10%.

Thus, when it is assumed that the reference switching frequency set for the DC/DC converter 110 is 500 kHz, the reference switching frequency set for the charge pump 120 is 1 MHz, and the reference ratio is 10%, the control unit 300 may set the bandwidth for the reference switching frequency of the DC/DC converter 110 to a range of 450 kHz to 550 kHz, and set the bandwidth for the reference switching frequency of the charge pump 120 to a range of 0.9 MHz to 1.1 MHz. Then, each of the elements may be less affected by interference caused by electromagnetic wave noise which is generated by the switching frequency of another element.

However, the present embodiment is not limited thereto. When interference occurs in the operations of the plurality of elements 100, the control unit 300 may set the bandwidths for the respective reference switching frequencies according to more various standards.

Furthermore, in the present embodiment, the control unit 300 may set a bandwidth only for a reference switching frequency corresponding to an element 100 which causes interference among the plurality of elements 100.

That is, although an element 100 which causes no interference is operated according to the corresponding reference switching frequency, no interference occurs. Thus, the control unit 300 may set an increased bandwidth only for the reference switching frequency of the element 100 which causes interference. Therefore, an unnecessary bandwidth adjusting process can be omitted.

The bandwidth adjusting unit 400 may increase bandwidth of the reference switching frequencies supplied through the switching frequency supply unit 200, based on the bandwidths for the respective reference switching frequencies set through the control unit 300.

In particular, the bandwidth adjusting unit 400 can increase the bandwidth of the reference switching frequencies through a spread spectrum method. The spread spectrum method is a kind of modulation method, and widens the transmission range of a signal passing through a frequency band in the form of random sampling.

Figure 2:
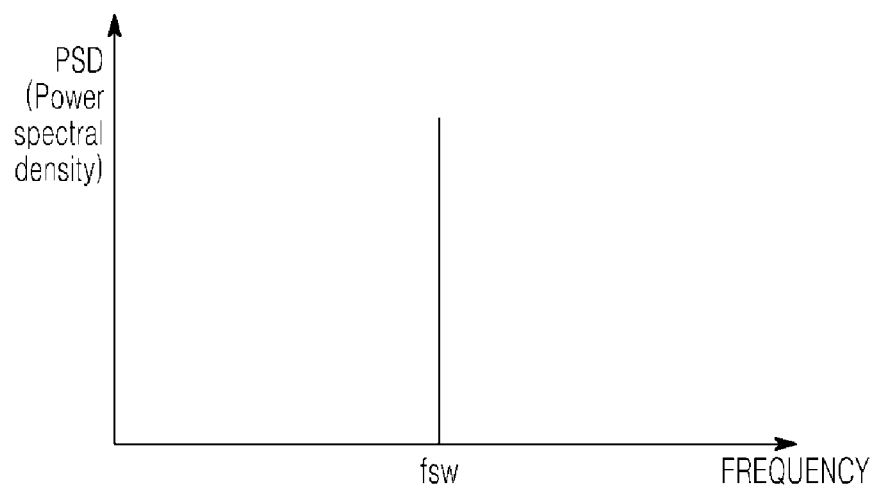
FIG. 2 and FIG. 3 are diagrams illustrating an example in which the apparatus for controlling a power source semiconductor in accordance with the embodiment of the present invention increases the bandwidth of a switching frequency according to the spread spectrum method.
Figure 3:
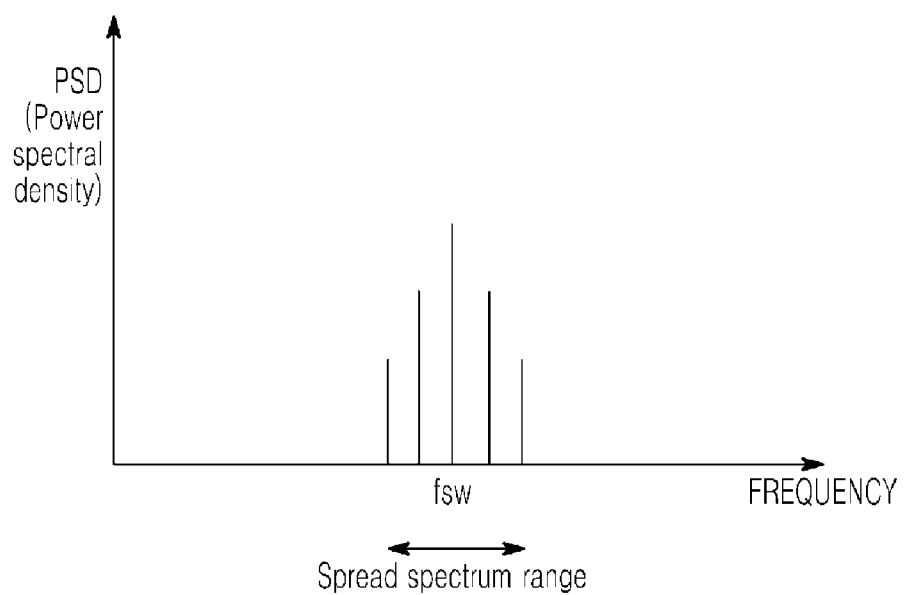

FIGS. 2 and 3 are diagrams illustrating an example in which the apparatus for controlling a power source semiconductor in accordance with the embodiment of the present invention increases the bandwidth of a switching frequency according to the spread spectrum method.

FIG. 2 is a diagram illustrating a reference switching frequency supplied to a specific element of the apparatus for controlling a power source semiconductor in accordance with the embodiment of the present invention, when no interference is sensed in the specific element. FIG. 3 is a diagram illustrating a reference switching frequency of a specific element of which the bandwidth is increased by the spread spectrum method in the apparatus for controlling a power source semiconductor in accordance with the embodiment of the present invention.

As illustrated in FIG. 3, the bandwidth adjusting unit 400 may increase a frequency bandwidth and lower power spectrum density (PSD) at the center frequency FSW, thereby reducing the influence of noise on the operations of the respective elements 100.

In the present embodiment, it has been described that the bandwidth adjusting unit 400 directly increases the bandwidths of the reference switching frequencies supplied through the switching frequency supply unit 200. However, the present embodiment is not limited thereto, but the bandwidths of the reference switching frequencies can be increased through various methods which are not described.

That is, the plurality of elements 100 may receive the respective reference switching frequencies from the switching frequency supply unit 200, and the bandwidth adjusting unit 400 may transmit information on the bandwidths set through the control unit 300 to the plurality of elements 100. Thus, the bandwidth of the reference switching frequencies can be increased through the logic circuits inside the plurality of elements 100.

FIG. 4 is a flowchart illustrating a method for controlling a power source semiconductor in accordance with an embodiment of the present invention.

Referring to FIG. 4, the method for controlling a power source semiconductor in accordance with the embodiment of the present invention will be described as follows. First, the switching frequency supply unit 200 may supply preset respective reference switching frequencies to the plurality of elements 100 which are operated according to a respective switching frequency, at step S10.

That is, since the plurality of elements 100 forming the power semiconductor require different switching frequencies according to the operation characteristics of the respective elements, the respective reference switching frequencies indicating the switching frequencies required for the operations of the respective elements 100 may be previously set. Thus, the switching frequency supply unit 200 may supply the reference switching frequencies required for the operations of the respective elements 100.

The control unit 300 may sense interference in the plurality of element 100 based on the operations of the elements 100 according to the respective reference switching frequencies, at step S20.

Specifically, in order to sense the interference in the plurality of elements 100, the control unit 300 may use a method of determining whether target outputs which are to be outputted from the plurality of elements 100 fall within an error range. Furthermore, the control unit 300 may sense the interference in the plurality of elements 100 through various methods which are publicly known or not publicly known.

Then, when the interference in the plurality of elements 100 is sensed at step S200, the control unit 300 may set bandwidths for the respective reference switching frequencies, at step S30.

Specifically, the control unit 300 may set the bandwidths for the respective switching frequencies to values corresponding to the magnitudes of the respective reference switching frequencies. More specifically, the control unit 300 may set the bandwidths for the respective reference switching frequencies to values proportional to the magnitudes of the reference switching frequencies.

For example, the control unit 300 may set the bandwidths for the respective switching frequencies to values obtained by multiplying the respective reference switching frequencies by a preset reference ratio.

Then, the bandwidth adjusting unit 400 may increase the bandwidth of the reference switching frequencies supplied through the switching frequency supply unit 200, based on the bandwidths set through the control unit 300, at step S40.

In particular, the bandwidth adjusting unit 400 can increase the bandwidth of the reference switching frequencies through a spread spectrum method. The spread spectrum method is a kind of modulation method, and widens the transmission range of a signal passing through a frequency band in the form of random sampling.

In accordance with the present embodiment, when interference caused by electromagnetic wave noise is sensed among elements operating at a fixed switching frequency, the apparatus and method for controlling a power source semiconductor can increase the bandwidth of the reference switching frequencies and then operate the elements, thereby preventing a malfunction of an element due to the interference.

Although preferred embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. A method for controlling a power source semiconductor, comprising:
   supplying, by an oscillator, preset respective reference switching frequencies to a plurality of elements which are operated according to a respective switching frequency;
   sensing, by a controller, sensing interference in the plurality of elements, based on operations of the elements according to the respective reference switching frequencies;

setting, by the controller, bandwidths for the respective reference switching frequencies when the interference in the plurality of elements is sensed; and increasing, by the controller, bandwidth of the respective reference switching frequencies supplied through the oscillator, based on the bandwidths for the respective reference switching frequencies, wherein in the setting of the bandwidths for the respective reference switching frequencies, the controller sets the bandwidths for the respective reference switching frequencies such that the bandwidths are proportional to a magnitude of respective reference switching frequency.

2. The method of claim 1, wherein in the increasing of the bandwidth of the reference switching frequencies, the controller increases the bandwidth of the reference switching frequencies through a spread spectrum method.

3. The method of claim 1, wherein the plurality of elements which are operated according to the respective switching frequency comprise a DC/DC converter and a charge pump.

4. The method of claim 1, wherein in the setting of the bandwidths for the respective reference switching frequencies, the controller sets the bandwidths for the respective reference switching frequencies to values obtained by multiplying the respective reference switching frequency by a preset reference ratio.

5. An apparatus for controlling a power source semiconductor, comprising:

an oscillator supplying preset respective reference switching frequencies to a plurality of elements which are operated according to a respective switching frequency;

a controller sensing interference in the plurality of elements based on the operations of the elements according to the respective reference switching frequencies, setting bandwidths for the respective reference switching frequencies when the interference in the elements is sensed, and increasing bandwidth of the respective reference switching frequencies supplied through the oscillator, based on the bandwidths for the respective reference switching frequencies, wherein the controller sets the bandwidths for the respective reference switching frequencies such that the bandwidths are proportional to a magnitude of respective reference switching frequency.

6. The apparatus of claim 5, wherein the controller increases the bandwidth of the respective reference switching frequencies through a spread spectrum method.

7. The apparatus of claim 5, wherein the plurality of elements which are operated according to the respective switching frequency comprise a DC/DC converter and a charge pump.

8. The apparatus of claim 5, wherein the controller sets the bandwidths for the respective reference switching frequencies to values obtained by multiplying the respective reference switching frequency by a preset reference ratio.

* * * * *